United States Patent
Xiong et al.

(10) Patent No.: US 11,040,763 B2
(45) Date of Patent: Jun. 22, 2021

(54) FRAME ASSEMBLY FOR UNMANNED AERIAL VEHICLE (UAV), AND UAV HAVING THE SAME

(71) Applicant: SZ DJI TECHNOLOGY CO., LTD., Shenzhen (CN)

(72) Inventors: Rongming Xiong, Shenzhen (CN); Yin Tang, Shenzhen (CN); Xianwu Xiong, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 164 days.

(21) Appl. No.: 16/364,647

(22) Filed: Mar. 26, 2019

(65) Prior Publication Data
US 2019/0217939 A1    Jul. 18, 2019

Related U.S. Application Data

(63) Continuation of application No. PCT/CN2016/100107, filed on Sep. 26, 2016.

(51) Int. Cl.
*B64C 1/06* (2006.01)
*B64C 39/02* (2006.01)
*H05K 5/00* (2006.01)

(52) U.S. Cl.
CPC .............. *B64C 1/061* (2013.01); *B64C 1/068* (2013.01); *B64C 39/024* (2013.01); *H05K 5/0008* (2013.01)

(58) Field of Classification Search
CPC ....... B64C 1/061; B64C 1/068; B64C 39/024; H05K 5/0008
See application file for complete search history.

(56) References Cited

U.S. PATENT DOCUMENTS

| 7,325,772 | B1 | 2/2008 | Hanewinkel et al. |
| 2008/0273316 | A1* | 11/2008 | Sarno ................... H05K 7/1412 361/807 |
| 2014/0231582 | A1 | 8/2014 | Headrick |
| 2015/0245516 | A1* | 8/2015 | Christensen .......... B64C 39/024 362/470 |
| 2015/0259066 | A1 | 9/2015 | Johannesson et al. |
| 2015/0307178 | A1 | 10/2015 | Fink et al. |

(Continued)

FOREIGN PATENT DOCUMENTS

| CN | 203301847 U | 11/2013 |
| CN | 103818544 A | 5/2014 |

(Continued)

OTHER PUBLICATIONS

World Intellectual Property Organization (WIPO) International Search Report for PCT/CN2016/100107 dated Jun. 28, 2017 5 Pages.

*Primary Examiner* — Rodney A Bonnette
(74) *Attorney, Agent, or Firm* — Anova Law Group, PLLC

(57) ABSTRACT

The present disclosure provides a frame assembly for an unmanned aerial vehicle. The frame assembly comprises a housing having an electric chamber and a circuit board assembly disposed in the electric chamber and including a first circuit board and a second circuit board. The electric chamber has an upper opening and a lower opening; and the first circuit board is installed in the electric chamber via the upper opening, and the second circuit board is installed in the electric chamber via the lower opening and spaced apart from the first circuit board.

20 Claims, 5 Drawing Sheets

(56) References Cited

U.S. PATENT DOCUMENTS

2015/0336670 A1* 11/2015 Zhang .................. B29C 43/003
　　　　　　　　　　　　　　　　　　　　　244/119
2017/0283050 A1* 10/2017 Baek ..................... B64C 39/024

FOREIGN PATENT DOCUMENTS

| CN | 105372097 A | 3/2016 |
| CN | 205345317 U | 6/2016 |
| CN | 105799909 A | 7/2016 |
| CN | 105836099 A | 8/2016 |
| CN | 105857588 A | 8/2016 |
| CN | 206087260 U | 4/2017 |

* cited by examiner

FRAME ASSEMBLY FOR UNMANNED AERIAL VEHICLE (UAV), AND UAV HAVING THE SAME

CROSS-REFERENCE TO RELATED APPLICATION

This application is a continuation application of International Application No. PCT/CN2016/100107, filed on Sep. 26, 2016, the entire contents of which are incorporated herein by reference.

TECHNICAL FIELD

The present disclosure relates to unmanned aerial vehicles (UAVs) and, more particularly, relates to a frame assembly for UAVs and UAVs having the same.

BACKGROUND

At present, unmanned aerial vehicles (UAVs) are usually configured with two circuit boards to accommodate the electronic speed controllers, the flight controllers and the functional components for image transmission. To save space, the two circuit boards are often sequentially installed in the UAV housing from top to bottom. A positioning post is used in the housing to pre-position the two circuit boards. The positioning post for the upper circuit board passes through the lower circuit board, reducing the effective usage of the lower circuit board. After the circuit boards are pre-positioned, they are packaged using a cover plate configured on the UAV housing. When maintenance is required, for example, when the bottom circuit board fails and needs to be repaired, the upper circuit board must be disassembled first, resulting in inconvenient maintenance and potential damage to the upper circuit board during disassembly.

In addition, since the circuit boards are configured to be stacked, there are other drawbacks such as poor heat dissipation. The disclosed methods and systems are directed to solve one or more problems set forth above and other problems.

SUMMARY

In an aspect of the present disclosure, a frame assembly for an unmanned aerial vehicle (UAV) is provided. The frame assembly comprises a housing having an electric chamber and a circuit board assembly disposed in the electric chamber and including a first circuit board and a second circuit board. The electric chamber has an upper opening and a lower opening; and the first circuit board is installed in the electric chamber via the upper opening, and the second circuit board is installed in the electric chamber via the lower opening and spaced apart from the first circuit board.

In another aspect of the present disclosure, an unmanned aerial vehicle (UAV) is provided. The UAV comprises a body provided with a frame assembly, at least one arms coupled to the body, and at least one propellers arranged on the at least one more arms. The frame assembly of the UAV comprises a housing having an electric chamber and a circuit board assembly disposed in the electric chamber and including a first circuit board and a second circuit board. The electric chamber has an upper opening and a lower opening; and the first circuit board is installed in the electric chamber via the upper opening, and the second circuit board is installed in the electric chamber via the lower opening and spaced apart from the first circuit board.

Other aspects of the present disclosure can be understood by those skilled in the art in light of the description, the claims, and the drawings of the present disclosure. The above general description and the following detailed description are intended to be illustrative and not restrictive.

BRIEF DESCRIPTION OF THE DRAWINGS

In order to more clearly illustrate the technical solutions in the embodiments of the present disclosure, the drawings used in the description of the embodiments will be briefly described below.

DETAILED DESCRIPTION OF THE EMBODIMENTS

Figure 1:
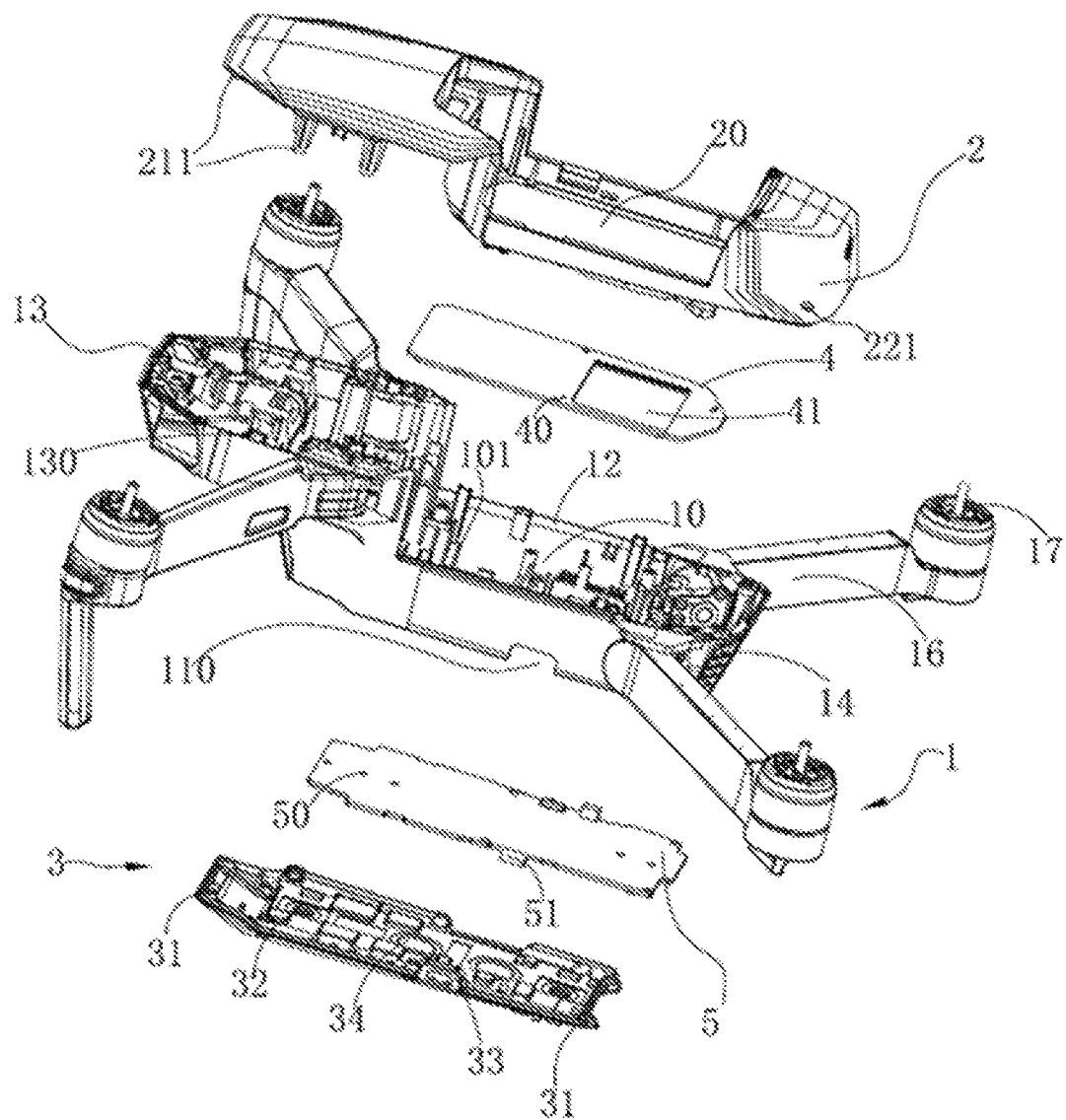
FIG. 1 is an exploded perspective view of a frame assembly according to an embodiment of the present disclosure.

Technical solutions of the present disclosure will be described with reference to the accompanying drawings. It will be appreciated that the described embodiments are some but not all of the embodiments of the present disclosure. Other embodiments derived by those with ordinary skills in the art on the basis of the described embodiments without inventive efforts should fall within the scope of the present disclosure.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. The terms "perpendicular," "horizontal," "left," "right," and similar expressions used herein are merely intended for description.

Unless otherwise defined, all the technical and scientific terms used herein have the same or similar meanings as generally understood by one of ordinary skill in the art. As described herein, the terms used in the specification of the present disclosure are intended to describe exemplary embodiments, instead of limiting the present disclosure. The term "and/or" used herein includes any suitable combination of one or more related items listed.

It should be noted that, in the present disclosure, relational terms such as first and second are used merely to distinguish one entity or operation from another entity or operation, and do not necessarily require or imply that there is any actual relationship or order between these entities or operations. The terms "comprises," "comprising,", "includes", "including", or any terms derived from them are non-exclusive. An element that is defined by the phrase "comprising a . . . " does not exclude the presence of additional equivalent elements in the process, method, item, or device that comprises the element. For simplification purposes, detailed descriptions of the operations of example systems, devices, and units may be omitted and references can be made to the descriptions of the example methods.

The units described as separate components may or may not be physically separate, and a component shown as a unit may or may not be a physical unit. That is, the units may be located in one place or may be distributed over a plurality of network elements. Some or all of the components may be selected according to the actual needs to achieve the object of the present disclosure. In addition, the functional units in the various embodiments of the present disclosure may be integrated in one processing unit, or each unit may be an individual physically unit, or two or more units may be integrated in one unit.

With the rapid development of UAV technologies, the requirements for operational stability and the performance of image transmission are increased. To meet these performance requirements, a UAV is typically configured with two circuit boards that are assembled with one on top of the other. This configuration requires a fixed assembly sequence and, because the upper circuit board requires a positioning post or a fixing structure that passes through the lower circuit board, the effective usage area of the lower circuit board may be reduced. Further, when the lower circuit board malfunctions and requires repair, the upper circuit board and the packaging cover need to be disassembled first, adding additional disassembly process and likely causing damage to the upper circuit board during the disassembly process.

Certain embodiments of the present disclosure provide a solution for stacking the two circuit boards. Without increasing the size of the UAV, each circuit board is separately mounted to the housing, ensuring effective usage area of each circuit board. The sequence of assembly of the circuit boards are not limited and it only needs to disassemble a corresponding circuit board during maintenance.

FIG. 1 is an exploded perspective view of a frame assembly in an embodiment. As shown in FIG. 1, a UAV comprises a body, one or more arms 16 coupled to the body, and a propeller (not shown) coupled to each arm 16. A frame assembly is provided for the body.

The frame assembly includes a housing 1 and a circuit board assembly. The housing 1 has an electric chamber 10. The electric chamber 10 has an upper opening 12 and a lower opening (not numbered). The circuit board assembly includes a first circuit board 4 and a second circuit board 5. The first circuit board 4 is mounted in the electric chamber 10 via the upper opening 12, and the second circuit board 5 is mounted in the electric chamber 10 via the lower opening and spaced apart from the first circuit board 4. In certain embodiments, the first circuit 4 board and/or the second circuit board 4 are removably installed in the electric chamber 10.

In certain embodiments, the upper opening 12 of the electric chamber 10 is provided with an upper cover 2 above the first circuit board 4. A lower cover 3 is provided for the lower opening of the electric chamber 10 below the second circuit board 5. That is, when the first circuit board 4 is mounted in the electric chamber 10 via the upper opening 12, the upper cover 2 is arranged above the first circuit board 4; when the second circuit board 5 is mounted in the electric chamber 10 via the lower opening, the lower cover 3 is arranged below the second circuit board 5.

In certain embodiments, the housing 1 may be a part of the body, and both the upper cover 2 and the lower cover 3 may form an outer contour of the body as well. That is, the housing 1 is assembled with the upper cover 2 and the lower cover 3 to form a main body.

Figure 2:
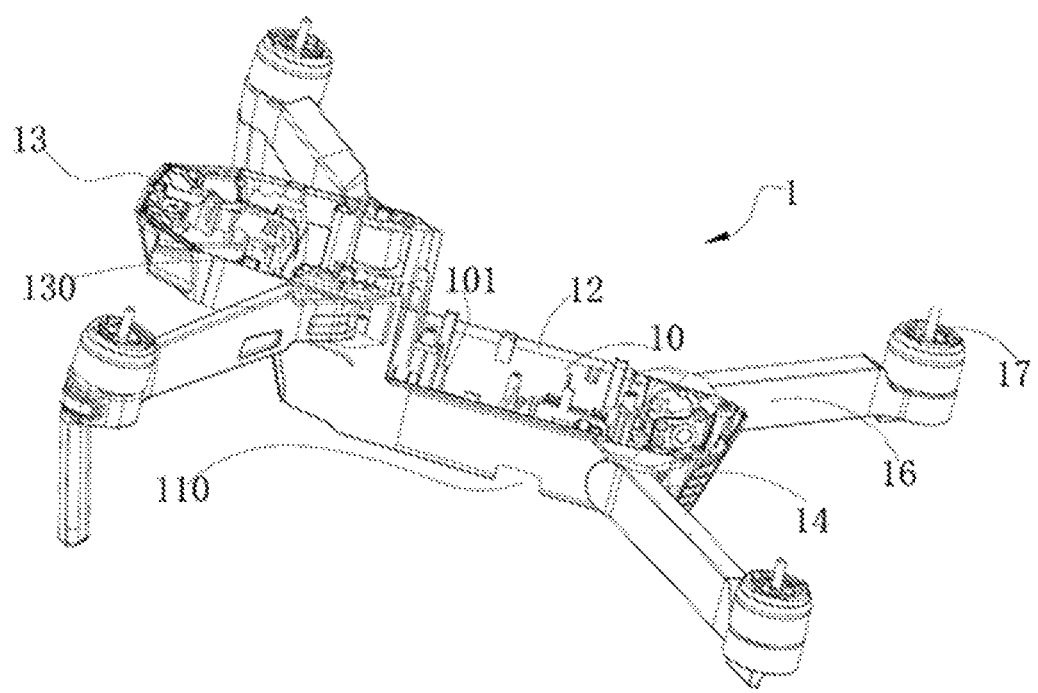
FIG. 2 is a structural view of a housing of a frame assembly according to an embodiment of the present disclosure.
Figure 3:
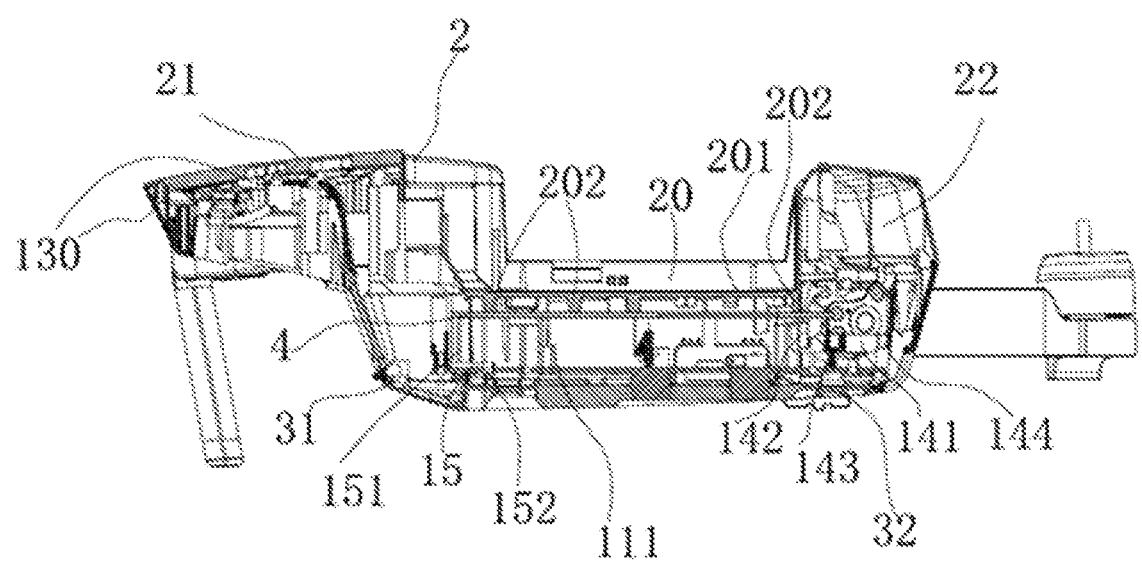
FIG. 3 is a cross-sectional side view of a frame assembly according to an embodiment of the present disclosure.

FIG. 2 is a structural view of the housing of the frame assembly. FIG. 3 is a cross-sectional side view of a frame assembly. As shown in FIGS. 1-3, the housing 1 has a chamber structure formed by a plurality of side walls. A mounting plate 15 (shown in FIG. 3) is formed by extending a pair of opposite-facing side walls of the electric chamber 10. The mounting plate 15 is used for installing the first circuit board 4 and/or the second circuit board 5. The mounting plate 15 is provided with a mounting post 151 extending in the direction of the upper opening 12 and a mounting post 152 extending in the direction of the lower opening.

Further, the first circuit board 4 comprises a first set of positioning holes 40, and the second circuit board 5 comprises a second set of positioning holes 50. In certain embodiments, the first circuit board 4 and the second circuit board 5 may be installed in the electric chamber 10 by assembling screws into the first set of positioning holes 40 and the second set of positioning holes 50, respectively.

The electric chamber 10 may be further provided with a plurality of positioning posts 101 corresponding to the first set of positioning holes 40. The positioning posts 101 can be formed by extending or protruding from a sidewall of the electric chamber 10 or from the mounting plate 15.

In certain embodiments, the first circuit board 4 is assembled into the electric chamber 10 via the upper opening. After the assembly, the positioning posts 101 may be inserted into the first positioning holes 40 to fix the first circuit board 4. In certain other embodiments, the positioning posts 101 are cylindrical structures having internal threads, and the first circuit board 4 may be assembled in the electric chamber 10 with screws in the first set of positioning holes 40 and the positioning posts 101.

In certain embodiments, the electric chamber 10 is further provided with a plurality of positioning posts 111 corresponding to the second set of positioning holes 50. In certain embodiments, the second circuit board 5 is assembled into the electric chamber 10 from the lower opening. After the assembly, the positioning posts 111 may be inserted into the second positioning holes 50 to fix the second circuit board 5. The mounting plate 15 may define the highest mounting surface of the second circuit board 5.

In certain other embodiments, the positioning posts 111 may be cylindrical structures having internal threads. The second circuit board 5 may be assembled in the electric chamber 10 using screws assembled in the second set of positioning holes 50 and the positioning posts 111.

In certain embodiments, the housing 1 is provided with an assembly socket 110 on the lower side wall of the electric chamber 10, and the lower cover 3 is provided with a buckle portion 33 that is inserted into the socket 110.

As shown in FIGS. 1-3, in certain embodiments, the housing 1 extends in the horizontal direction to form a head portion 13 and a tail portion 14. The tail portion 14 is provided with an assembly block 141. The assembly block 141 comprises one or more assembly holes 142 for fixing the first circuit board 4 and one or more assembly hole 143 for fixing the second circuit board 5. The first circuit board 4 is secured within the electric chamber 10 with screws that are assembled within the assembly holes 142. The second circuit board 5 is secured in the electric chamber 10 with screws assembled in the assembly holes 143.

Figure 4:
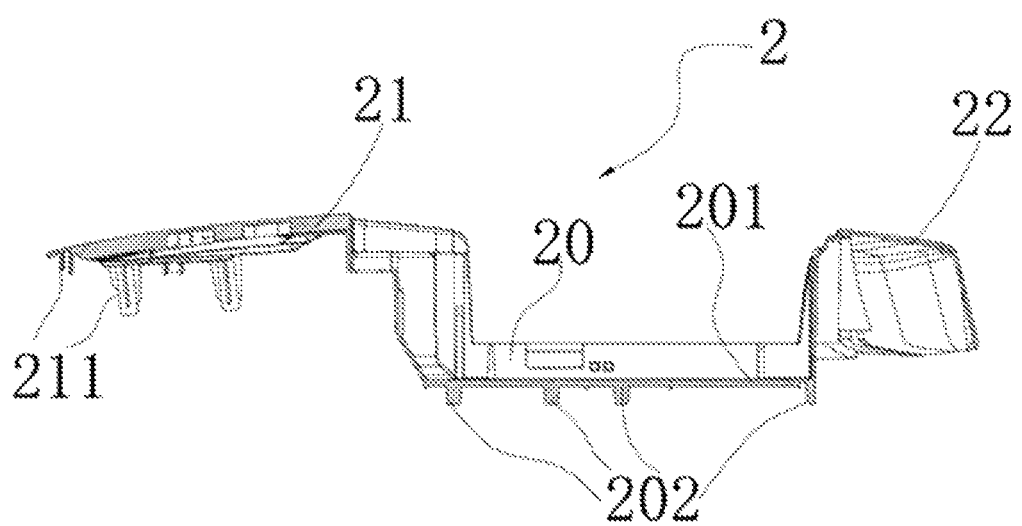
FIG. 4 is a cross-sectional view of an upper cover according to an embodiment of the present disclosure.

FIG. 4 is a cross-sectional view of the upper cover according to certain embodiments of the present disclosure. As shown in FIG. 1 and FIG. 4, the upper cover 2 is structurally matched and coupled to the housing 1. The upper cover 2 comprises a first mounting portion 21 assembled with the head portion 13 of the housing 1 and a second mounting portion 22 assembled with the tail portion 14 of the housing 1. A battery compartment 20 for accommodating a battery is arranged between the first mounting portion 21 and the second mounting portion 22. Further, the housing head portion 13 is provided with a plurality of assembly openings 130, and the first mounting portion 21 is provided with columnar blocks 211 that may be inserted into the assembly openings 130. The second mounting portion 22 comprises one or more screw assembly holes 221. When the upper cover 2 is assembled with the housing 1, the screws assembled into the assembly holes 221 are screwed into the assembly block 141 of the housing 1, so that the upper cover 2 is fixed to the housing 1.

The battery compartment 20 is located above the electric chamber 10 and has a base plate 201, which forms the bottom of the battery compartment. The battery (not shown) may be mounted and electrically connected to the upper cover 2 and is held by the base plate 201. The battery and the first circuit board 4 are respectively arranged on top and bottom sides of the base plate 201. The battery is mounted above the first circuit board 4 and isolated from the first circuit board 4. The top surface of the battery may form part of the body.

In certain embodiments, the distance between the first circuit board 4 and the battery may be shorter than the distance between the second circuit board 5 and the battery.

In certain embodiments, the base plate 201 extends downward towards the inner surface of the electric chamber 10 to form a plurality of limiting blocks 202. The limiting blocks 202 are spaced apart and abut on the first circuit board 4 when the circuit board is installed. An installation space is formed between the limiting blocks 202, the inner surface of the base plate 201 and the upper surface of the first circuit board 4. The installation space is used for accommodating the electrical elements mounted on the first circuit board 4. When the base plate 201 is under pressure (when the battery is disassembled), the limiting block 202 can disperse the pressure to avoid damage to the first circuit board 4.

Figure 5:
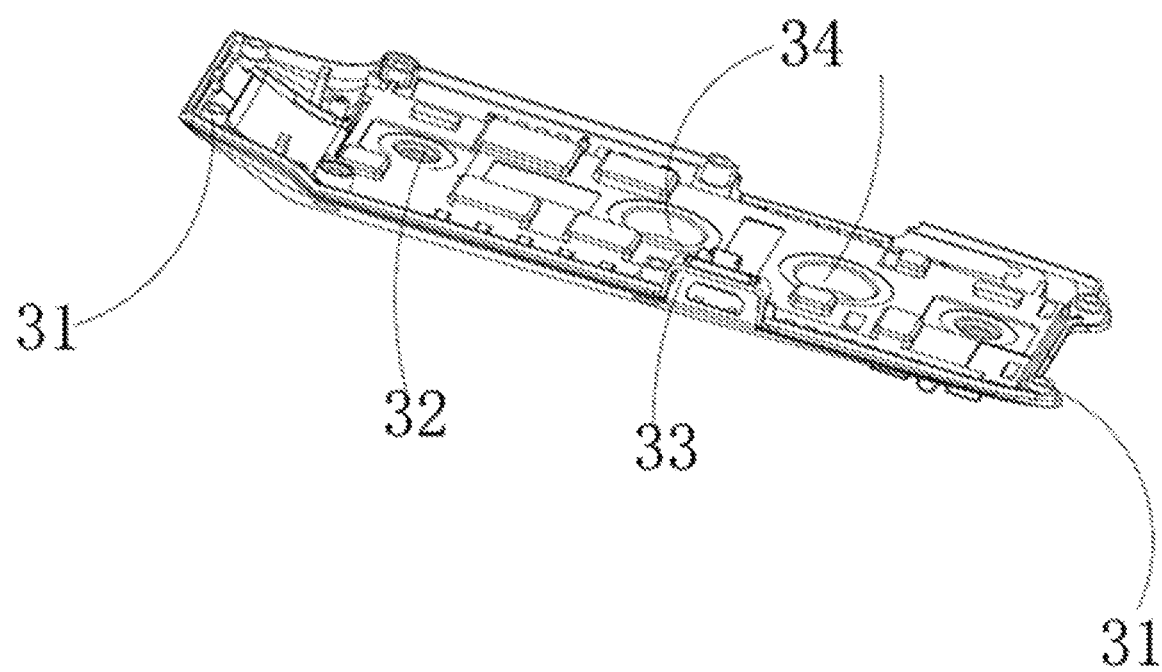
FIG. 5 is a perspective view of a lower cover according to an embodiment of the present disclosure.

FIG. 5 is a perspective view of the lower cover 3 according to certain embodiments of the present disclosure.

As shown in FIG. 1 and FIG. 5, the lower cover 3 has an elongated structure, and comprises a plurality of protrusions 31 which are engaged with the housing 1 along the edge. The lower cover 3 further comprises a plurality of screw holes 32 for assembling the lower cover to the housing 1 with screws. In certain embodiments, the second circuit board 5 is provided with an ultrasonic element 51, and the lower cover 3 comprises a receiving portion 34 for accommodating the ultrasonic element 51.

In certain embodiments, the first circuit board 4 is provided with an electronic speed control unit and a flight control unit. As shown in FIG. 1, the first circuit board 4 comprises an opening 41 for soldering the flight control unit. An image transmission management unit may be arranged on the second circuit board 5, so that the second circuit board 5 is more heated than the first circuit board 4 during the operation of the image transmission management unit. By assembling the second circuit board 5 using the single-layer lower cover 3, heat dissipation can be improved. In certain embodiments, the first circuit board 4 and the second circuit board 5 are installed in the electric chamber 10 of the housing 1 with a spacing. This facilitates heat dissipation of the battery assembly and enhance electromagnetic shielding of the first circuit board and the second circuit board. Placing the second circuit board 5 in a position away from the battery also facilitates heat dissipation of the battery assembly. In order to further enhance the electromagnetic shielding effect of the second circuit board 5, the lower cover 3 may be a metal cover.

Further, as shown in FIG. 1, the housing 1 may be connected to one or more arms 16. Each arm 16 is configured with a motor 17 for connecting with the propeller.

Thus, according to the disclosed frame assembly of a UAV and the UAV having the same thereof, a frame assembly capable of independently mounting two stacked circuit boards is provided. The two circuit boards do not require to be sequentially mounted during installation, only the corresponding circuit board needs to be dismounted during maintenance, making the assembly and disassembly processes more convenient. Further, the two circuit boards are installed independently, ensuring that the effective use of the circuit board area is not affected.

The foregoing provides a detailed description of the apparatus provided by the embodiments of the present disclosure. The principles and embodiments of the present disclosure are described herein by using specific examples. The description of the above embodiments is only for helping to understand the method of the present disclosure. At the same time, there will be changes in the specific embodiments and application scopes according to the idea of the present disclosure, and the contents of the present specification should not be construed as being limiting.

What is claimed is:

1. A frame assembly for an unmanned aerial vehicle (UAV), comprising:
   a housing having an electric chamber; and
   a circuit board assembly disposed in the electric chamber and comprising a first circuit board and a second circuit board,
   wherein:
      the electric chamber has an upper opening and a lower opening; and
      the first circuit board is installed in the electric chamber via the upper opening, and the second circuit board is installed in the electric chamber via the lower opening and spaced apart from the first circuit board.

2. The frame assembly according to claim 1, wherein the first circuit board and the second circuit board are removably mounted within the electric chamber.

3. The frame assembly according to claim 2, wherein:
   the first circuit board has at least one first positioning hole;
   the second circuit board has at least one second positioning hole; and
   the first circuit board and the second circuit board are mounted within the electric chamber by installing screws through the at least one first positioning hole and the at least one second positioning hole, respectively.

4. The frame assembly according to claim 2, wherein the electric chamber is provided with a plurality of positioning posts, and the first circuit board and/or the second circuit board are provided with a plurality of positioning holes corresponding to the plurality of positioning posts.

5. The frame assembly according to claim 1, wherein the first circuit board is provided with an electronic speed control unit and a flight control unit, and the second circuit board is provided with an image transfer management unit.

6. The frame assembly according to claim 1, wherein the upper opening of the electric chamber is provided with an upper cover installed above the first circuit board, and the lower opening of the electric chamber is provided with a lower cover installed below the second circuit board.

7. The frame assembly according to claim 6, wherein the lower cover is a metal cover.

8. The frame assembly according to claim 6, wherein the housing is provided with an assembly socket on a side wall of the electric chamber, and the lower cover is provided with a buckle portion for being inserted into the assembly socket.

9. The frame assembly according to claim 6, wherein the upper cover comprises a battery compartment for receiving a battery installed above the first circuit board and isolated from the first circuit board.

10. The frame assembly according to claim 6, wherein the upper cover comprises one or more limiting blocks, and the one or more limiting blocks abut on the first circuit board.

11. The frame assembly according to claim 10, wherein the upper cover comprises two or more limiting blocks that extend downwardly from an inner surface of the upper cover and the limiting blocks are spaced apart from each other.

12. An unmanned aerial vehicle (UAV), comprising:
a body provided with a frame assembly; and
at least one arm coupled to the body;
wherein the frame assembly comprises a housing having an electric chamber; and a circuit board assembly disposed in the electric chamber and comprising a first circuit board and a second circuit board,
wherein the electric chamber has an upper opening and a lower opening; and the first circuit board is installed in the electric chamber via the upper opening, and the second circuit board is installed in the electric chamber via the lower opening and spaced apart from the first circuit board.

13. The unmanned aerial vehicle according to claim 12, wherein:
the upper opening of the electric chamber is provided with an upper cover installed above the first circuit board;
the lower opening of the electric chamber is provided a lower cover installed below the second circuit board; and
the upper cover comprises a battery compartment for receiving a battery installed above the first circuit board and isolated from the first circuit board.

14. The unmanned aerial vehicle according to claim 13, wherein:
the upper cover comprises at least one limiting block, the at least one limiting block abutting on the first circuit board.

15. The unmanned aerial vehicle according to claim 13, wherein:
the upper cover comprises two or more limiting blocks, the two or more limiting blocks extend downward from an inner surface of the upper cover and spaced apart from each other.

16. The unmanned aerial vehicle according to claim 15, wherein the two or more limiting blocks, the inner surface of the upper cover, and an upper surface of the first circuit board form an installation space for receiving electrical components mounted on the first circuit board.

17. The unmanned aerial vehicle according to claim 13, wherein the upper cover, the lower cover, and one of the housing or an upper surface of the battery are each part of the body of the UAV.

18. The unmanned aerial vehicle according to claim 13, further comprising a battery, wherein:
the upper cover comprises a base plate having an upper side and a lower side, the base plate being a bottom of the battery compartment; and
the battery is mounted on and electrically connected to the upper cover and held by the base plate.

19. The unmanned aerial vehicle according to claim 18, wherein the battery and the first circuit board are respectively arranged above the upper side and below the lower side of the base plate.

20. The unmanned aerial vehicle according to claim 19, wherein a distance between the first circuit board and the battery is less than a distance between the second circuit board and the battery.

* * * * *